United States Patent
Ahn

(10) Patent No.: US 7,355,900 B2
(45) Date of Patent: Apr. 8, 2008

(54) OUTPUT BUFFER CIRCUIT FOR SEMICONDUCTOR MEMORY DEVICE

(75) Inventor: Young-Man Ahn, Yongin-si (KR)

(73) Assignee: Samsung Electronics Co., Ltd, Suwon-si, Gyeonggi-do (KR)

( * ) Notice: Subject to any disclaimer, the term of this patent is extended or adjusted under 35 U.S.C. 154(b) by 63 days.

(21) Appl. No.: 11/360,506

(22) Filed: Feb. 24, 2006

(65) Prior Publication Data

US 2006/0239084 A1    Oct. 26, 2006

(30) Foreign Application Priority Data

Apr. 20, 2005    (KR) .................. 10-2005-0032827

(51) Int. Cl.
    *G11C 7/10*    (2006.01)
(52) U.S. Cl. .................... 365/189.05; 365/189.01; 365/230.08
(58) Field of Classification Search .......... 365/189.05, 365/200, 189.01, 190, 230.08
    See application file for complete search history.

(56) References Cited

U.S. PATENT DOCUMENTS

| 4,571,706 | A | * | 2/1986 | Iwahashi et al. ............. 365/200 |
| 5,265,048 | A | * | 11/1993 | Kimura ................. 365/189.01 |
| 5,576,759 | A | * | 11/1996 | Kawamura et al. .... 348/207.99 |
| 7,116,574 | B2 | * | 10/2006 | Sugahara et al. ........... 365/156 |

FOREIGN PATENT DOCUMENTS

| JP | 06-311017 | 11/1994 |
| JP | 11-046135 | 2/1999 |
| KR | 1019950010626 B1 | 9/1995 |
| KR | 1020000045903 | 7/2000 |

* cited by examiner

*Primary Examiner*—Gene N. Auduong
(74) *Attorney, Agent, or Firm*—Volentine & Whitt, PLLC

(57) ABSTRACT

There is provided an output buffer circuit for a semiconductor memory device. The output buffer circuit includes: a main buffer and parallel connected auxiliary buffer receiving an input signal. A selection circuit controls the auxiliary buffer by selectively defining a selected input signal in relation to the input signal and an adjacent input signal.

20 Claims, 9 Drawing Sheets

| DIN1 | DIN2 | XOR[1,2] | Size Of Output Buffer |
|---|---|---|---|
| 0 | 0 | 0 | Main Buffer |
| 0 | 1 | 1 | Main Buffer+Auxiliary Buffer |
| 1 | 0 | 1 | Main Buffer+Auxiliary Buffer |
| 1 | 1 | 0 | Main Buffer |

Fig. 8

| DIN | | | Comparison Result | | Size Of Output Buffer |
|---|---|---|---|---|---|
| N-1 | N | N+1 | XOR[N-1,N] | XOR[N,N+1] | |
| 0 | 0 | 0 | 0 | 0 | Main Buffer |
| 0 | 0 | 1 | 0 | 1 | Main Buffer+Auxiliary Buffer1EA |
| 0 | 1 | 0 | 1 | 1 | Main Buffer+Auxiliary Buffer2EA |
| 0 | 1 | 1 | 1 | 0 | Main Buffer+Auxiliary Buffer1EA |
| 1 | 0 | 0 | 1 | 0 | Main Buffer+Auxiliary Buffer1EA |
| 1 | 0 | 1 | 1 | 1 | Main Buffer+Auxiliary Buffer2EA |
| 1 | 1 | 0 | 0 | 1 | Main Buffer+Auxiliary Buffer1EA |
| 1 | 1 | 1 | 0 | 0 | Main Buffer |

Fig. 9

| \ | DIN | | | | | DIN | | | | Size Of Output Buffer |
|---|---|---|---|---|---|---|---|---|---|---|
| | N-2 | N-1 | N | N+1 | N+2 | N-2,N | N-1,N | N,N+1 | N,N+2 | |
| | 0 | 0 | 0 | 0 | 0 | 0 | 0 | 0 | 0 | Main Buffer |
| | 0 | 0 | 0 | 0 | 1 | 0 | 0 | 0 | 1 | Main Buffer+Auxiliary Buffer1EA |
| | 0 | 0 | 0 | 1 | 0 | 0 | 0 | 1 | 0 | Main Buffer+Auxiliary Buffer1EA |
| | 0 | 0 | 0 | 1 | 1 | 0 | 0 | 1 | 1 | Main Buffer+Auxiliary Buffer2EA |
| | 0 | 0 | 1 | 0 | 0 | 1 | 1 | 1 | 1 | Main Buffer+Auxiliary Buffer4EA |
| | 0 | 0 | 1 | 0 | 1 | 1 | 1 | 1 | 0 | Main Buffer+Auxiliary Buffer3EA |
| | 0 | 0 | 1 | 1 | 0 | 1 | 1 | 0 | 1 | Main Buffer+Auxiliary Buffer3EA |
| | 0 | 0 | 1 | 1 | 1 | 0 | 1 | 0 | 0 | Main Buffer+Auxiliary Buffer2EA |
| | 0 | 1 | 0 | 0 | 0 | 0 | 0 | 0 | 0 | Main Buffer+Auxiliary Buffer1EA |
| | ... | ... | ... | ... | ... | ... | ... | ... | ... | ... |
| | 1 | 1 | 1 | 0 | 1 | 0 | 0 | 1 | 0 | Main Buffer+Auxiliary Buffer1EA |
| | 1 | 1 | 1 | 1 | 0 | 0 | 0 | 0 | 1 | Main Buffer+Auxiliary Buffer1EA |
| | 1 | 1 | 1 | 1 | 1 | 0 | 0 | 0 | 0 | Main Buffer |

OUTPUT BUFFER CIRCUIT FOR SEMICONDUCTOR MEMORY DEVICE

BACKGROUND OF THE INVENTION

1. Field of the Invention

Embodiments of the invention relate to a semiconductor memory device. More particularly, embodiments of the invention relate to an output buffer circuit for a semiconductor memory device.

This application claims priority to Korean Patent Application No. 10-2005-32827, filed on Apr. 20, 2005, the subject matter of which is hereby incorporated by reference in its entirety.

2. Description of the Related Art

Semiconductor memory devices are well known and widely used to store and retrieve data. There are many different kinds of semiconductor memory devices, but they may be generally classified as random access memory (RAM) and a read only memory (ROM). A RAM device is a volatile memory device that loses stored data when power is interrupted. A ROM device is a nonvolatile memory device that holds stored data in spite of an interruption in power. RAM devices include dynamic RAM devices and static RAM devices. ROM devices include programmable ROM devices, erasable RPOM devices, electrically erasable/programmable EPROM devices, and flash memory devices.

Regardless of their specific design, semiconductor memory devices include a plurality of output buffer circuits. An output buffer circuit generally receives a plurality of input signals, and thereafter, simultaneously outputs a plurality of corresponding output signals during an output mode of operation. Figure (FIG.) 1 is a block diagram illustration of a conventional plurality of output buffer circuits.

Referring to FIG. 1, sixteen (16) output buffer circuits, including 100_1, ..., 100_N−1, 100_N, 100_N+1, and, 100_16 are illustrated. Each of these output buffer circuits respectively receives input signals DIN_1, ..., DIN_N−1, DIN_N, DIN_N+1, DIN_16, and correspondingly outputs output signals DOUT_1, ..., DOUT_N−1, DOUT_N, DOUT_N+1, ..., DOUT_16. In the illustrated example, it is assumed that each of output buffer circuits has essentially the same structure and performs essentially identical operations. As one more detailed example, output buffer circuit 100_N is formed from an inverter including a P-MOS transistor PT11 and an NMOS transistor NT11. Output buffer circuit 100_N is adapted to receive the input signal DIN_N and output a corresponding output signal DOUT_N.

FIG. 2 shows a typical waveform for output signal DOUT_N provided by output buffer circuit 100_N of FIG. 1.

Referring to FIG. 2, the waveform is formed by dividing the output signal continuously provided from the output buffer circuit by one cycle and combining the divided output signals. Waveform A is formed by combining the divided high level output signals, and waveform B is formed by combining the divided low level output signals. Waveform A is provided when the input signal is low and waveform B is provided when the input signal is high. In this context, the terms "high" and "low" refer to arbitrarily defined, alternate logic or signal states, as is common in the art.

As shown in FIG. 2, the output buffer circuit provides a somewhat distorted output signal due to an accumulation of signal noise. Noise often arises when the input signal applied to DIN_N is low, but an adjacent input signal (e.g., one applied to DIN_N+1 and/or DIN_N−1) is high. Noise may also arise when the input signal applied to DIN_N is high, but an adjacent signal (e.g., one applied to DIN_N+1 and/or DIN_N−1) is low. At extreme levels, adjacent channel induced noise (or cross-talk) may make the output signal provided by the output buffer circuit unintelligible. Thus, there exists a continuing demand for an output buffer circuit providing output signals with reduced noise, despite the presence of different signal levels on adjacent signal lines.

SUMMARY OF THE INVENTION

Embodiments of the invention provide an output buffer circuit adapted to provide output signals having reduced noise when the output buffer circuit receives an input signal having a different voltage level than signal(s) applied to adjacent output circuits.

Thus, in one embodiment, the invention provides an output buffer circuit for a semiconductor memory device comprising; a main buffer receiving an input signal, an auxiliary buffer connected in parallel around the main buffer and adapted to receiving a selected input signal, and a selection circuit adapted to control the auxiliary buffer by defining the selected input signal in response to the input signal and an adjacent input signal.

In another embodiment, the invention provides an output buffer circuit for a semiconductor memory device comprising; a main buffer for receiving an input signal, a first auxiliary buffer connected in parallel around the main buffer and adapted to receive the input signal, a second auxiliary buffer connected in parallel with the main buffer and the first auxiliary buffer and adapted to receive the input signal, a first selection circuit adapted to controlling the first auxiliary buffer to selectively receive a selected input signal in response to the input signal and a first adjacent input signal, and a second selection circuit adapted to control the second auxiliary buffer to selectively receive a selected input signal in response to the input signal and a second adjacent input signal.

In yet another embodiment, the invention provides a method of providing an output signal from an output buffer circuit, comprising a main buffer and an auxiliary buffer connected in parallel, the method comprising; receiving an input signal at the main buffer, and selectively receiving the input signal at the auxiliary buffer in response to the input signal and an adjacent input signal.

BRIEF DESCRIPTION OF THE DRAWINGS

Several embodiments of the invention are described with reference to the accompanying drawings, in which:

FIG. 8 is another logic table showing exemplary size definitions for the output buffer circuit shown in FIG. 7;

FIG. 9 is yet another logic table showing exemplary size definitions for the output buffer circuit shown in FIG. 7; and, FIG. 10 is a graph showing a waveform for an output signal provided by the output buffer circuit shown in FIG. 7

DESCRIPTION OF EXEMPLARY EMBODIMENTS

Reference will now be made in some additional detail to several embodiments of the invention. However, the present invention is not limited to only the illustrated embodiments. Rather, the illustrated embodiments are presented as teaching examples. The actual scope of the invention is defined by the attached claims.

Figure 1:
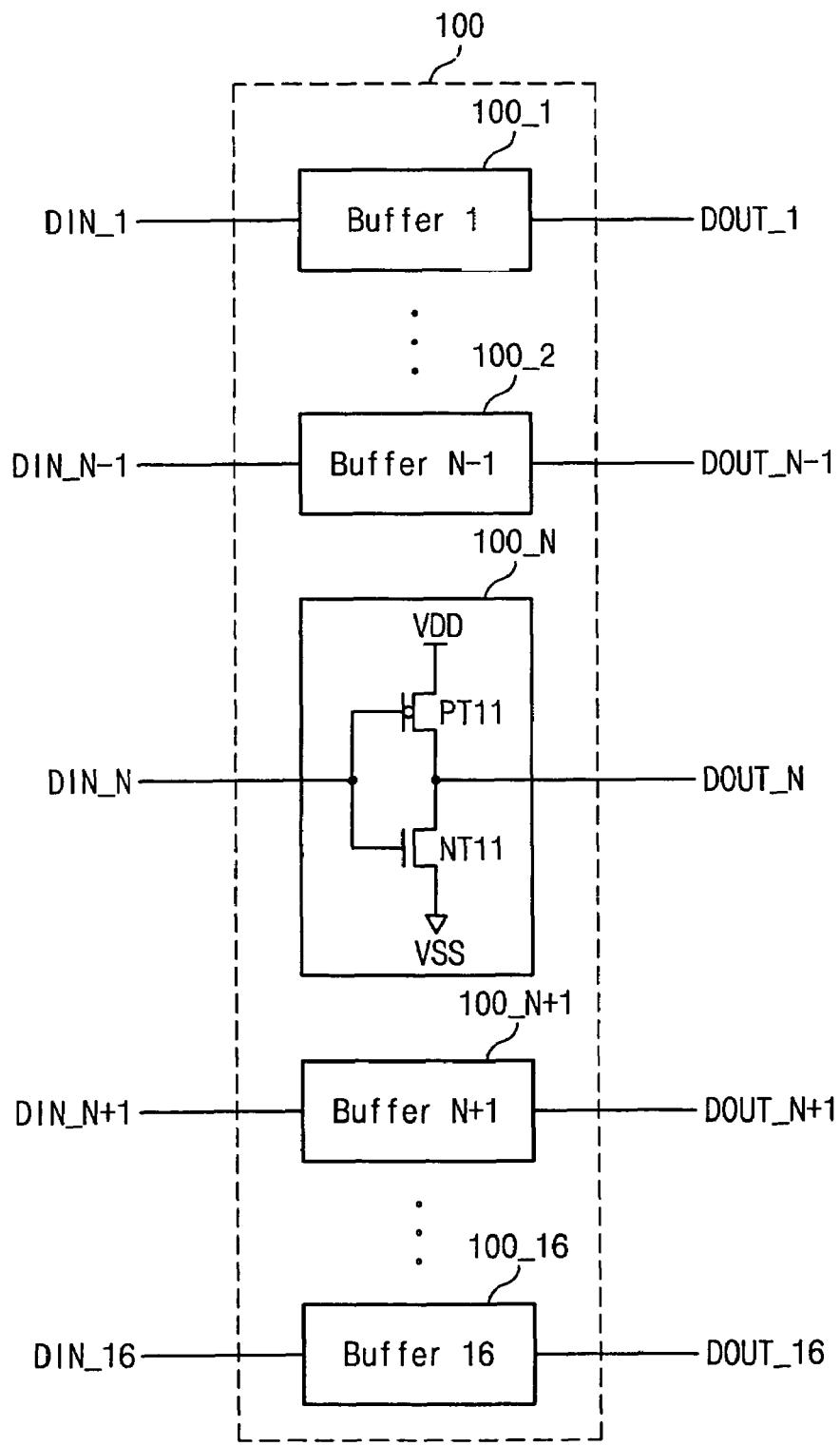
FIG. 1 is a block diagram showing a plurality of conventional output buffer circuits.
Figure 2:
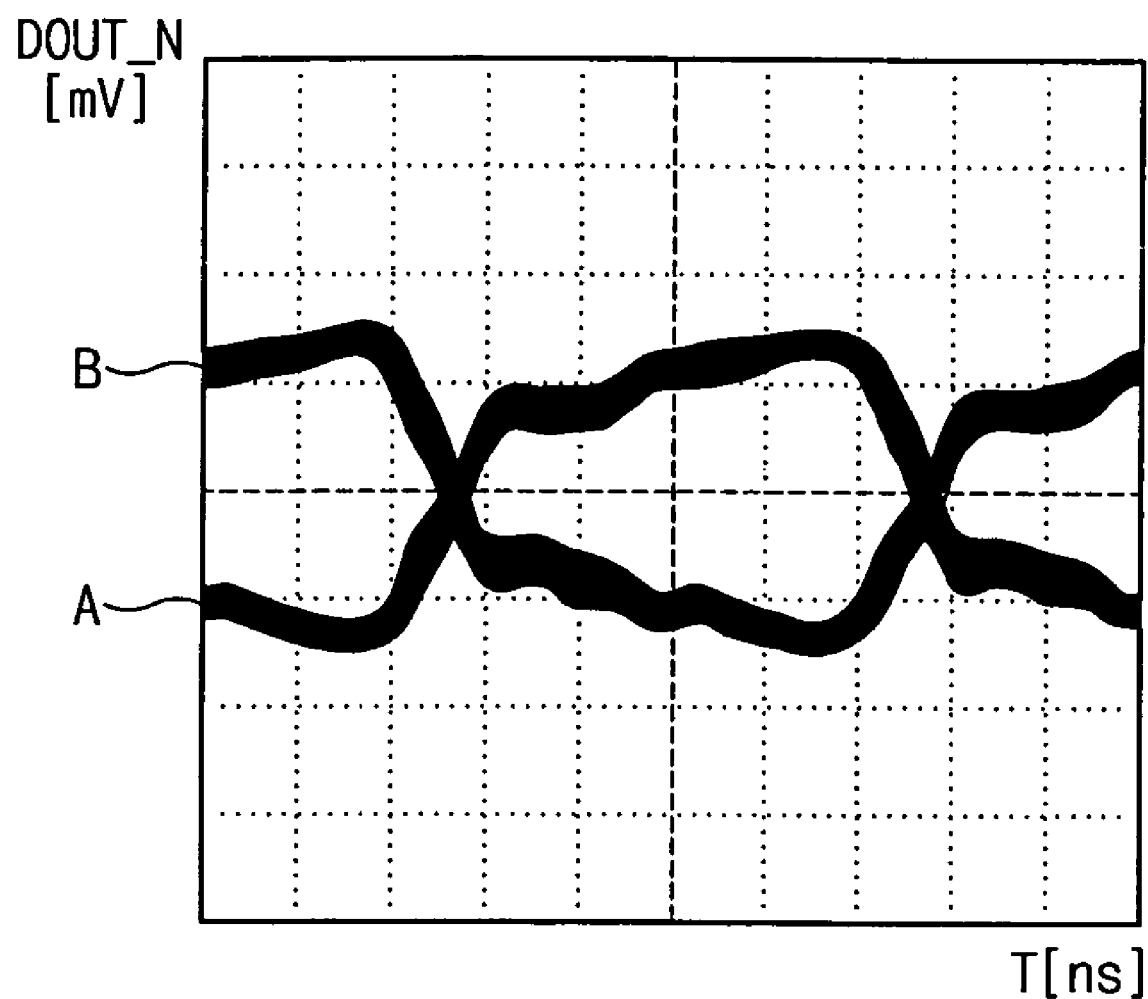
FIG. 2 shows a waveform for an output signal DOUT_N provided by output buffer circuit 100_N shown in FIG. 1.
Figure 3:
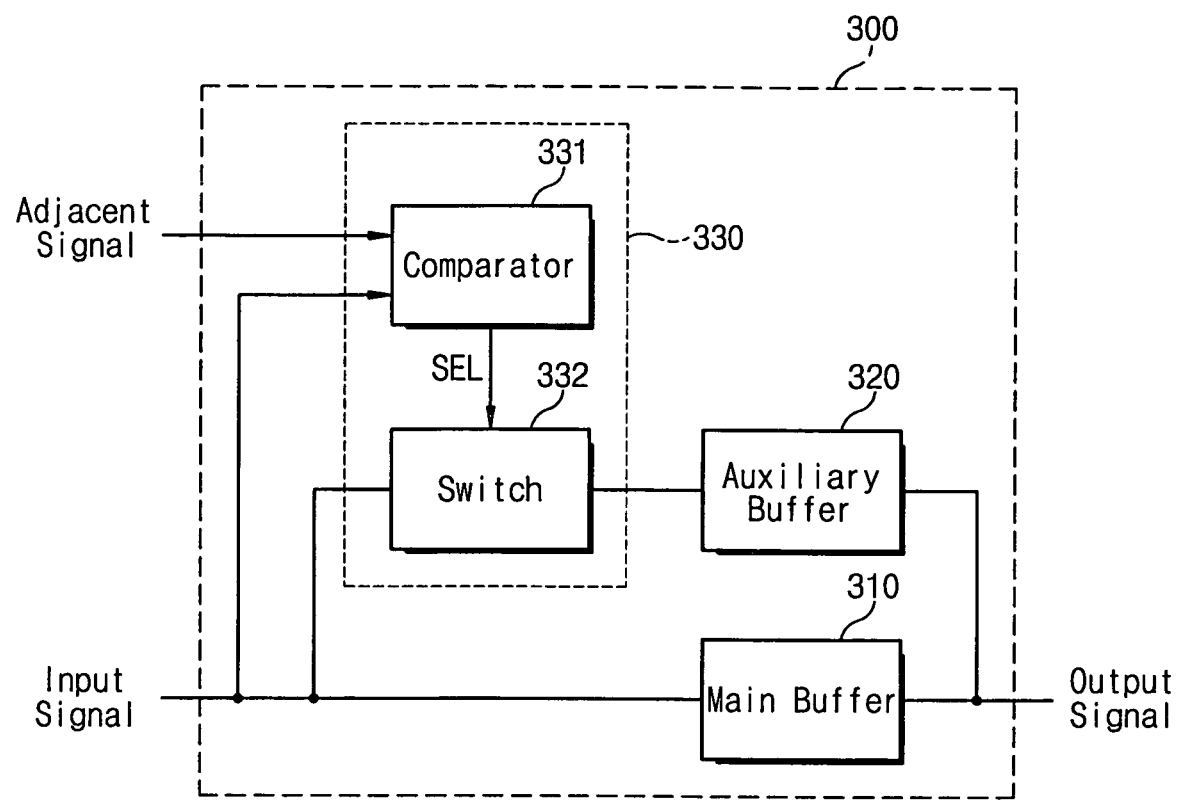
FIG. 3 is a block diagram illustrating an output buffer circuit for a semiconductor memory device according to one embodiment of the present invention.

FIG. 3 is a block diagram illustrating an output buffer circuit for a semiconductor memory device according to a one embodiment of the invention. Referring to FIG. 3, the exemplary output buffer circuit 300 comprises a main buffer 310, an auxiliary buffer 320 and a selection circuit 330.

Main buffer 310 receives an input signal from an input terminal and provides a corresponding output signal at an output terminal. Auxiliary buffer 320 is connected in parallel around main buffer 310 and receives a selected input signal from selection circuit 330 and provides a corresponding output signal at the output terminal.

Selection circuit 330 is connected between the input signal terminal and auxiliary buffer 320. In this position, selection circuit 330 controls the input signal received by auxiliary buffer 320. That is, selection circuit 330 defines the selected input signal in relation to the input signal received at the input signal terminal and an adjacent input signal received at an adjacent input terminal.

Referring to FIG. 3, selection circuit 330 comprises a comparator 331 and a switch 332. Comparator 331 compares the input signal and the adjacent input signal and generates a selection signal (SEL) according to the comparison result. Switch 332 provides a selected input signal to auxiliary buffer 320 in response to the selection signal (SEL). That is, switch 332 is turned ON, for example, in response to a logically high selection signal (SEL).

In the illustrated embodiment, output buffer circuit 300 uses main buffer 310 only when the input signal and the adjacent input signal have the same voltage level. If the input signal has a different voltage level than the adjacent input signal, output buffer circuit 300 uses both main buffer 310 and auxiliary buffer 320. In this manner, output buffer circuit 300 reduces the distortion of the output signal by effectively increasing the size of the buffer under circumstances wherein the input signal has a different voltage level than the adjacent input signal.

Figures 4, 5:
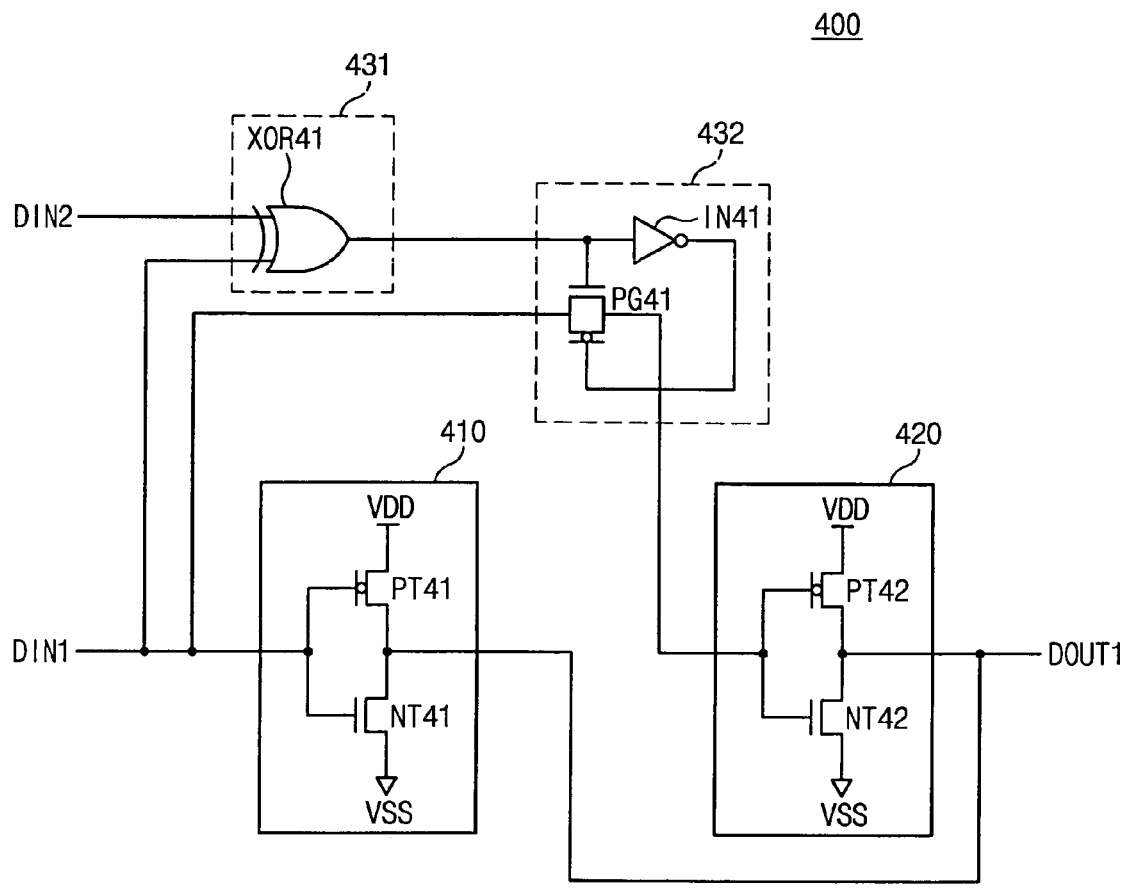
FIG. 4 is an equivalent circuit diagram for the output buffer circuit shown in FIG. 3.
FIG. 5 is a logic table showing exemplary size definitions for the output buffer circuit shown in FIG. 4.

FIG. 4 is one equivalent circuit diagram for the output buffer circuit shown in FIG. 3. Referring to FIG. 4, output buffer circuit 400 comprises a main buffer 410, an auxiliary buffer 420, a comparator 431 and a switch 432.

Main buffer 410 is formed from a push-pull type circuit comprising a pull-up transistor and a pull-down transistor. The pull-up transistor may be formed from a PMOS transistor PT41 and the pull-down transistor may be formed from NMOS transistor NT41, or vice versa. Complementary input signals are respectively applied to the gate terminals of the pull-up transistor and the pull-down transistor. With this exemplary configuration, main buffer 410 generates an output signal (DOUT1) having a reversed logic level in relation to input signal (DIN1).

Auxiliary buffer 420 may also be formed from a push-pull type circuit comprising a pull-up transistor and a pull-down transistor. Auxiliary buffer 420 is connected in parallel around main buffer 410 and includes a PMOS transistor PT42 and an NMOS transistor NT42. Auxiliary buffer 420 also generates output signal (DOUT1) by inverting the logic level of input signal (DIN1).

The size of main buffer 410 may be larger than that of auxiliary buffer 420. Alternatively, the size of main buffer 410 may be equal to or smaller than auxiliary buffer 420. That is, the size of auxiliary buffer 420 may vary over an allowable range. In one embodiment, main buffer 410 and/or auxiliary buffer 420 are configured using open-drain type logic devices.

In the illustrated example, comparator 431 is formed from an XOR gate XOR41 adapted to compare input signal (DIN1) with adjacent input signal (DIN2) and to generate a corresponding comparison result (XOR [1, 2]). Comparator 431 is designed to generate a low level comparison result when input signal (DIN1) has the same voltage level as the adjacent input signal, and a high level comparison result when input signal (DIN1) has a different voltage level than the adjacent input signal. However, the foregoing circuit is merely one example of many competent logic circuits readily adapted to the purpose ascribed to comparator 431 by those of ordinary skill in the art. Other arithmetic and/or logic circuits may be used instead of the illustrated XOR gate.

In the illustrated example, switch 432 comprises a pass transistor PG41 and an inverter IN41. Pass transistor PG41 is turned ON in response to a high level comparison result. Switch 432 provides input signal (DIN1) to auxiliary buffer 420 in response to the comparison result provided by comparator 431.

Output buffer circuit 400 of FIG. 4 uses only main buffer 410 when input signal (DIN1) has the same voltage level as adjacent input signal (DIN2). If input signal (DIN1) has a different voltage level than adjacent input signal (DIN2), output buffer circuit 400 uses both of main buffer 410 and auxiliary buffer 420.

FIG. 5 is a logic table showing an exemplary size definition for output buffer circuit 400. Where input signal (DIN1) and adjacent input signal (DIN2) commonly have logically low states or logically high states, (e.g., the comparison result—XOR [1, 2] output from the XOR gate—is 0), only main buffer 410 is used. Where, however, input signal (DIN1) and adjacent input signal (DIN2) have different logical states and corresponding voltage values, (e.g., the comparison result—XOR [1, 2] from the XOR gate is 1), both main buffer 410 and auxiliary buffer 420 are used.

Figure 6:
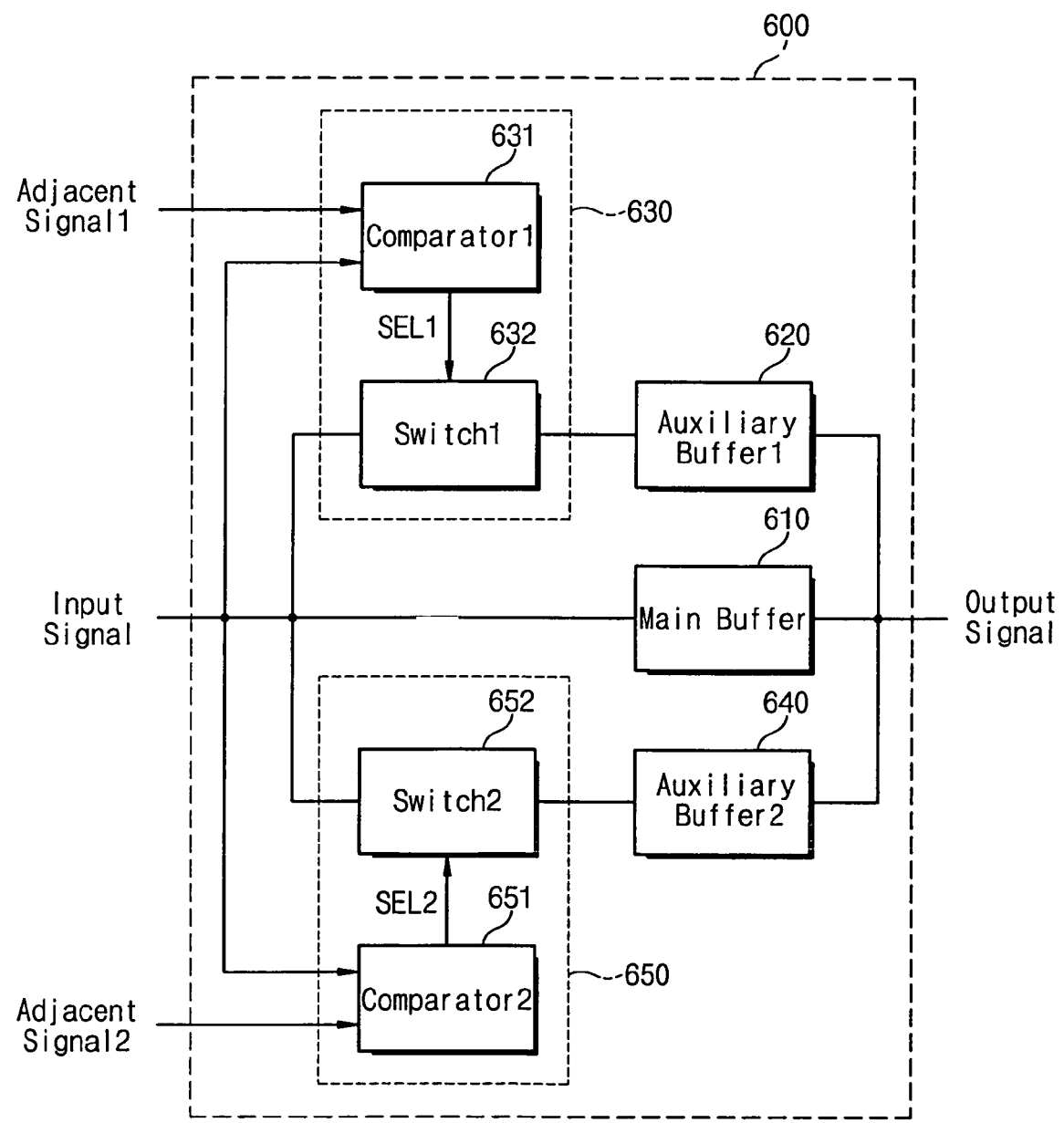
FIG. 6 is a block diagram illustrating an output buffer circuit for a semiconductor memory device according to another embodiment of the invention.

FIG. 6 is a block diagram illustrating an output buffer circuit for a semiconductor memory device according to another embodiment of the invention. Referring to FIG. 6, an output buffer circuit 600 comprises a main buffer 610, a first auxiliary buffer 620, a first selection circuit 630, a second auxiliary buffer 640 and a second selection circuit 650.

First selection circuit 630 controls first auxiliary buffer 620 to selectively receive a selected input signal in response to an input signal and a first adjacent input signal. Second selection circuit 650 controls the second auxiliary buffer 640 to selectively receive a selected input signal in response to an input signal and a second adjacent input signal. Otherwise, the operation of output buffer circuit 600 is similar to that of output buffer circuit 300 shown in FIG. 3.

Output buffer circuit 600 uses only main buffer 620 when the input signal has a same voltage level as the first and second adjacent input signals. If the input signal has a different voltage level than either one of the first and second adjacent input signals, output buffer circuit 600 uses first auxiliary buffer 620 or second auxiliary buffer 640 with main buffer 620. In this manner, output buffer circuit 600 reduces the distortion of the output signal by increasing the size of the buffer circuit when an input signal has a different voltage level than either one of the first and second adjacent input signals.

Figure 7:
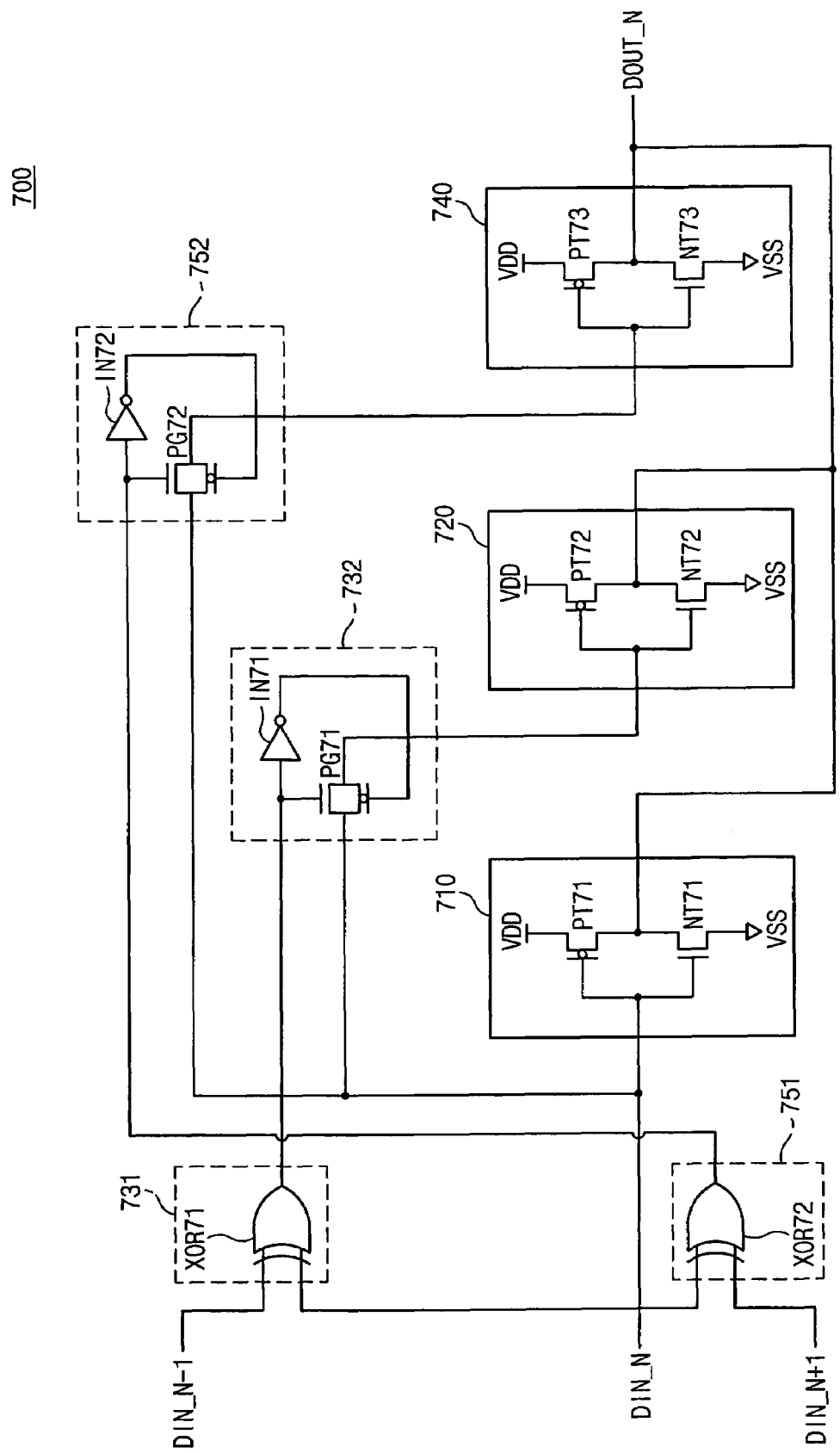
FIG. 7 is an equivalent circuit diagram for the output buffer circuit shown in FIG. 6.

FIG. 7 is an equivalent circuit diagram for output buffer circuit 600 shown in FIG. 6. Referring to FIG. 7, output buffer circuit 700 comprises a main buffer 710, a first auxiliary buffer 720, a first comparator 731, a first switch 732, a second auxiliary buffer 740, a second comparator 751 and a second switch 752.

First comparator 731 compares levels of an input signal (DIN_N) and a first adjacent input signal (DIN_N−1) and outputs a first comparison result (XOR[N−1, N]). According to the first comparison result (XOR [N−1, N]), output buffer circuit 700 determines whether the first auxiliary buffer 720 is additionally used with main buffer 710, or not.

Second comparator 751 compares the levels of input signal (DIN_N) and a second adjacent input signal (DIN_N+1) and outputs the second comparison result (XOR [N, N+1]). According to the second comparison result (XOR [N, N+1]), output buffer circuit 700 determines whether the second auxiliary buffer 740 is additionally used with main buffer 710, or not.

Output buffer circuit 700 uses only main buffer 710 when input signal (DIN_N) has a same voltage level as the first and second adjacent input signals (DIN_N−1 and DIN_N+1). Output buffer circuit 700 additionally uses one of the first and second auxiliary buffers 710 and 740 with the main buffer 710 when input signal (DIN_N) has a different voltage level from one of the first and second adjacent input signals (DIN_N−1 and DIN_N+1). Also, output buffer circuit 700 additionally uses both of the first and second auxiliary buffers 710 and 740 with the main buffer 710 when input signal (DIN_N) has a different voltage level from both of the first and second adjacent input signal (DIN_N−1 and DIN_N+1).

FIG. 8 is a logic table showing another exemplary definition of size for output buffer 700 shown in FIG. 7.

Referring to FIG. 8, output buffer circuit 700 may use a different number of auxiliary buffers according to the number of adjacent input signals (DIN_N−1 and DIN_N+1) having a different voltage level than input signal (DIN_N). For example, if input signal (DIN_N) has a logic value of 1, and the first and second adjacent input signals (DIN_N−1 and DIN_N+1) have respective logic values of 0 and 1, the first comparison result (XOR[N−1, N]) is generated to have a value of 1 and the second comparison result (XOR[N, N+1]) is generated to have a value of 0. Accordingly, the output buffer circuit uses one auxiliary buffer with the main buffer. However, if the input signal (DIN_N) has a logic value of 1 and the first and second adjacent input signals (DIN_N−1 and DIN_N+1) have logic levels of 0, output buffer circuit 700 uses both auxiliary buffers with the main buffer.

Figure 10:
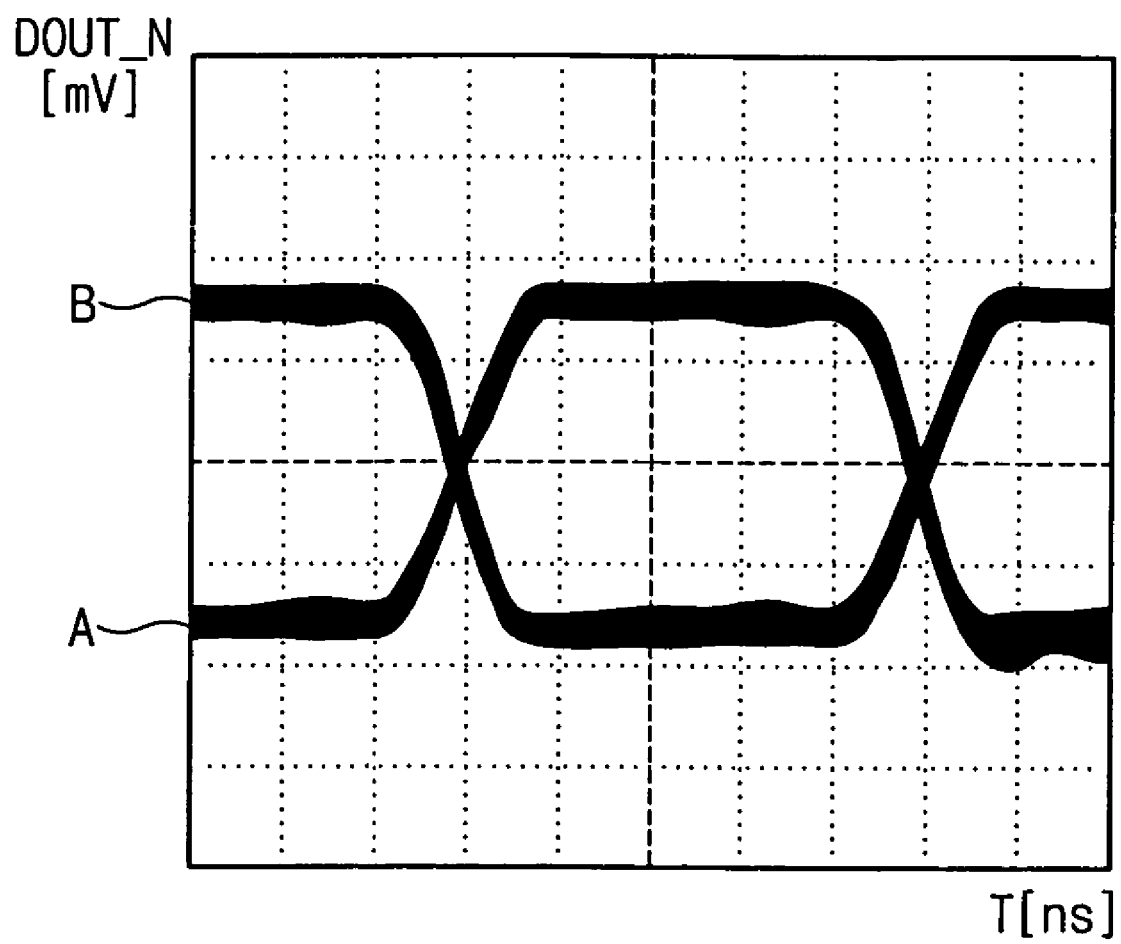

FIG. 9 is yet another logic table showing an exemplary definition of output buffer size in accordance with four adjacent signals (e.g., DIN_N−2, DIN_N−1, DIN_N+1 and DIN_N+2) which are applied to amongst a ganged plurality of output circuits. As shown in FIG. 9, the output buffer circuit uses a maximum of four auxiliary buffers when the number of "different" adjacent input signals is 4. For example, a competent output buffer circuit using this arrangement may use four auxiliary buffers with a main buffer when an input signal (DIN_N) is 1 and all of four adjacent input signals (DIN_N−2, DIN_N−1, DIN_N+1 and DIN_N+2) are FIG. 10 is a graph showing a waveform of output signal provided by an output buffer circuit, such as the one shown in FIG. 7. As before, the waveform shown in FIG. 10 is formed by dividing an output signal (DOUT_N) continuously outputted from the output buffer circuit by one cycle and combined the divided output signals together. Thus, waveform A shows the combined high level output signals, and waveform B shows the combined low level output signals. That is, waveform A is the output signal when the input signal (DIN_N) is low and the adjacent input signals (DIN_N+1 and DIN+N−1) are high. Waveform B is the output signal when the input signal (DIN_N) is high and the adjacent input signals (DIN_N−1 and DIN_N+1) are low.

FIG. 10 shows that output signal (DOUT_N) is not distorted although the input signal (DIN_N) has a different voltage level than the adjacent input signals (DIN_N−1 and DIN_N+1).

As described above, the output buffer circuit according to an embodiment of the invention reduces noise distortion in the output signal by comparing a selected input signal with adjacent input signals, and controlling the size of an output buffer in accordance with the comparison result.

It will be apparent to those skilled in the art that various modifications and variations may be made to the foregoing embodiments. Thus, it is intended that the present invention covers all such modifications and variations that fall within the scope of the following claims.

What is claimed is:

1. An output buffer circuit for a semiconductor memory device comprising:

a main buffer connected between an input terminal and an output terminal and receiving an input signal from the input terminal;

an auxiliary buffer and a selection circuit connected in series between the input terminal and the output terminal in parallel with the main buffer, wherein the selection circuit provides a selected input signal to the auxiliary buffer in response to the input signal and an adjacent input signal.

2. The output buffer circuit of claim 1, wherein the selection circuit comprises:

a comparator adapted to receive and compare the input signal and the adjacent input signal, and generate a selection signal as a comparison result; and a switch adapted to provide the selected input signal to the auxiliary buffer in response to the selection signal.

3. The output buffer circuit of claim 2, wherein the comparator generates the selection signal when the input signal has a different voltage level compared to the adjacent signal.

4. The output buffer circuit of claim 2, wherein the comparator is an XOR gate.

5. The output buffer circuit of claim 2, wherein the switch comprises a pass transistor that is turned ON or OFF in response to the selection signal.

6. The output buffer circuit of claim 2, wherein the main buffer is a push-pull type circuit.

7. The output buffer circuit of claim 1, wherein the auxiliary buffer is a push-pull type circuit.

8. The output buffer circuit of claim 1, wherein the main buffer is an open-drain type circuit.

9. The output buffer circuit of claim 1, wherein the auxiliary buffer is an open-drain type circuit.

10. An output buffer circuit for a semiconductor memory device comprising:
- a main buffer connected between an input terminal and an output terminal and receiving an input signal from the input terminal;
- a first auxiliary buffer and a first selection circuit connected in series between the input terminal and the output terminal in parallel with the main buffer;
- a second auxiliary buffer and a second selection circuit connected in series between the input terminal and the output terminal in parallel with the main buffer,
- wherein the first selection circuit provides a first selected input signal to the first auxiliary buffer in response to the input signal and a first adjacent input signal; and
- the second selection circuit provides a second selected input signal to the second auxiliary buffer in response to the input signal and a second adjacent input signal.

11. The output buffer circuit of claim 10, wherein the first selection circuit includes:
- a first comparator adapted to compare the input signal and the first adjacent input signal and generate the first selection signal as a first comparison result; and
- a first switch adapted to provide the first selected input signal to the first auxiliary buffer in response to the first selection signal.

12. The output buffer circuit of claim 11, wherein the first comparator generates the first selection signal when the input signal has a different voltage level than the first adjacent input signal.

13. The output buffer circuit of claim 11, wherein the second selection circuit includes:
- a second comparator adapted to compare the input signal and the second adjacent input signal and generate the second selection signal as a second comparison result; and
- a second switch adapted to provide the second selected input signal to the second auxiliary buffer in response to the second selection signal.

14. The output buffer circuit of claim 13, wherein the second comparator generates the second selection signal when the input signal has a different voltage level than the second adjacent input signal.

15. The output buffer circuit of claim 13, wherein the first and the second comparators each comprise an XOR gate.

16. The output buffer circuit of claim 13, wherein each one of the first and second switches comprises a pass transistor that is turned ON or OFF in response to the first and the second selection signals, respectively.

17. A method of providing an output signal from an output buffer circuit, the output buffer circuit comprising a main buffer connected between an input terminal and an output terminal, and a selection circuit and an auxiliary buffer series connected in parallel with the main buffer, the method comprising:
- providing an input signal to the selection circuit and the main buffer and providing an adjacent input signal to the selection circuit;
- controlling the size of the output buffer circuit in relation to the input signal and the adjacent input signal; and
- providing the output signal at the output terminal.

18. The method of claim 17, wherein controlling the size of the output buffer circuit comprises:
- generating a selection signal by comparing the input signal and the adjacent input signal in the selection circuit; and
- providing the input signal to the auxiliary buffer in response to the selection signal.

19. The method of claim 18, wherein the selection signal is generated when the input signal has a different voltage level than the adjacent input signal.

20. The method of claim 17, wherein controlling the size of the output buffer circuit comprises:
- providing the input signal to only the main buffer when the input signal and the adjacent input signal have the same voltage level, wherein the output signal apparent at the output terminal corresponds to the input signal stored in the main buffer; or
- providing the input signal to the main buffer and the auxiliary buffer when the input signal and the adjacent input signal have different voltage levels, wherein the output signal apparent at the output terminal corresponds to the input signal stored in the main buffer and the auxiliary buffer.

* * * * *